US011288476B2

(12) United States Patent
Nilsson et al.

(10) Patent No.: US 11,288,476 B2
(45) Date of Patent: Mar. 29, 2022

(54) FINGERPRINT SENSOR PACKAGE

(71) Applicant: FINGERPRINT CARDS AB, Gothenburg (SE)

(72) Inventors: Hanna Nilsson, Gothenburg (SE); Karl Lundahl, Gothenburg (SE)

(73) Assignee: FINGERPRINT CARDS ANACATUM IP AB, Gothenburg (SE)

( * ) Notice: Subject to any disclaimer, the term of this patent is extended or adjusted under 35 U.S.C. 154(b) by 103 days.

(21) Appl. No.: 16/609,684

(22) PCT Filed: Apr. 25, 2018

(86) PCT No.: PCT/SE2018/050426
§ 371 (c)(1),
(2) Date: Oct. 30, 2019

(87) PCT Pub. No.: WO2018/208205
PCT Pub. Date: Nov. 15, 2018

(65) Prior Publication Data
US 2020/0202100 A1    Jun. 25, 2020

(30) Foreign Application Priority Data
May 8, 2017    (SE) .................................... 1750555-3

(51) Int. Cl.
*G06K 9/00* (2006.01)
*G01L 1/14* (2006.01)
*G01L 1/22* (2006.01)

(52) U.S. Cl.
CPC ............ *G06K 9/00013* (2013.01); *G01L 1/14* (2013.01); *G01L 1/22* (2013.01)

(58) Field of Classification Search
CPC ............ H01L 23/3107; H01L 23/3128; H01L 2224/48247; H01L 2224/48227; G06K 9/00053

See application file for complete search history.

(56) References Cited

U.S. PATENT DOCUMENTS

| 5,394,751 A | * | 3/1995 | Ishibashi | ............ G01L 19/0084 |
| | | | | 257/676 |
| 2005/0001324 A1 | * | 1/2005 | Dunn | .................... H01L 23/498 |
| | | | | 257/762 |

(Continued)

FOREIGN PATENT DOCUMENTS

WO    2008008948 A2    1/2008

OTHER PUBLICATIONS

PCT International Search Report and Written Opinion dated Jun. 12, 2018 for International Application No. PCT/SE2018/050426, 10 pages.

*Primary Examiner* — Yuzhen Shen
(74) *Attorney, Agent, or Firm* — RMCK Law Group, PLC

(57) ABSTRACT

The present invention generally relates to a fingerprint sensor package comprising a substrate having thereon a plurality of electrical connection pads, a fingerprint sensor arranged on the substrate and electrically connected to at least one of the electrical connection pads, a bond wire loop formed from a bond wire having two ends of which at least one end is mechanically and electrically attached to a first one of the electrical connection pads, and a force sensing member in electrical contact with the first electrical connection pad via an upper portion of the bond wire loop, and in electrical contact with a second one of the electrical connection pads different from the first electrical connection pad, wherein an electrical property of the force sensing member is alterable in response to a deformation of the force sensing member.

11 Claims, 14 Drawing Sheets

(56) References Cited

U.S. PATENT DOCUMENTS

| | | |
|---|---|---|
| 2014/0109693 A1 | 4/2014 | Sakai |
| 2015/0163907 A1 | 6/2015 | Chang |
| 2016/0210495 A1 | 7/2016 | Jägemalm et al. |
| 2016/0210496 A1* | 7/2016 | Lin ................... H01L 23/3135 |
| 2017/0118875 A1 | 4/2017 | Kumbhat et al. |

* cited by examiner

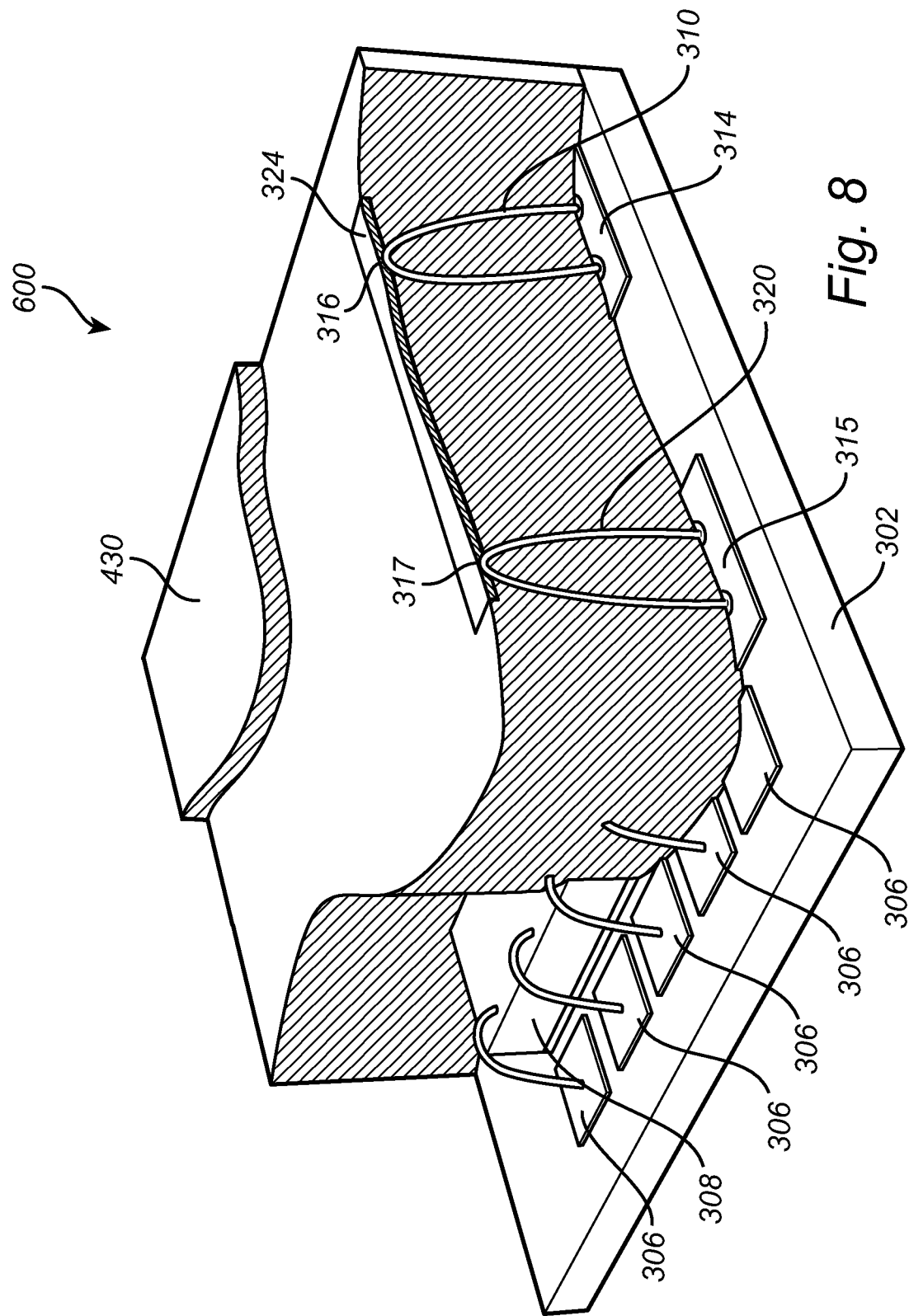

FINGERPRINT SENSOR PACKAGE

CROSS-REFERENCE TO RELATED APPLICATIONS

This application is a 371 U.S. National Stage of International Application No. PCT/SE2018/050426, filed Apr. 25, 2018, which claims priority to Swedish Patent Application No. 1750555-3, filed May 8, 2017. The disclosures of each of the above applications are incorporated herein by reference in their entirety.

TECHNICAL FIELD

The present invention generally relates to a fingerprint sensor package and to a method for manufacturing such a fingerprint sensor package.

BACKGROUND OF THE INVENTION

Various types of biometric systems are used more and more in order to provide an increased security for accessing an electronic device and at the same time keep the user convenience at an acceptable level. In particular fingerprint sensors have been successfully integrated in such devices, for example, thanks to their small form factor, high performance and user acceptance. Among the various available fingerprint sensing principles (such as capacitive, optical, thermal etc.), capacitive sensing is most commonly used, in particular in applications where size and power consumption are important.

There has lately been a desire on the consumer electronics market to increase the interaction between electronic devices such as mobile phones, tablets laptops etc., and the end user. The interaction is now not only related to the fingerprint information but also to for example the force applied on the fingerprint sensor. If the force can be measured a further way of providing feedback between the electronic device and the user is enabled, for example for providing feedback in the form of haptic feedback in response to an applied force. A determined force may further provide application possibilities related to improving timing of when to acquire a fingerprint image (e.g. at preferred pressure on the fingerprint sensor) or for spoof detection.

However, adding further functionalities to present fingerprint sensors poses challenges on the integration of components for providing the further functionalities such as force sensing. For example, space within electronic devices is limited, in particular in mobile phones which are typically relatively thin in the direction where the force would be desirable to be measured, typically perpendicular to the sensing surface of the fingerprint sensor. This makes integration of a force sensor in the fingerprint sensor somewhat problematic. Similar problems occur when trying to simply combine a separate force sensor with a separate fingerprint sensor which generally results in a relatively large stack of components.

Thus, there is a need for improvement with regards to integration of force sensing capabilities with fingerprint sensing.

SUMMARY OF THE INVENTION

In view of above-mentioned and other drawbacks of the prior art, it is an object of the present invention to provide a fingerprint sensor package with integrated force sensing capability in the same package. It is a further an object to provide a method for manufacturing such a fingerprint sensor package.

According to an aspect of the present invention, it is therefore provided a fingerprint sensor package comprising: a substrate having thereon a plurality of electrical connection pads; a fingerprint sensor arranged on the substrate and electrically connected to at least one of the electrical connection pads; a bond wire loop formed from a bond wire having two ends of which at least one end is mechanically and electrically attached to a first one of the electrical connection pads, and a force sensing member in electrical contact with the first electrical connection pad via a upper portion of the bond wire loop, and in electrical contact with a second one of the electrical connection pads different from the first electrical connection pad, wherein an electrical property of the force sensing member is alterable in response to a deformation of the force sensing member, wherein a signal indicative of the alternation of the electrical property is measureable across the electrical connection between the first electrical connection pad and the second electrical connection pad.

The present invention is based upon the realization that bond wire loops may provide an advantageous electronic connection for a force sensing member. The bond wire loops may be placed in suitable locations in the same wire bonding step as for wiring of the fingerprint sensor with minor or no changes of the fingerprint sensor with regards to appearance and/or integration in the package. Furthermore, the bond wire loops extend away from the substrate in a substantially orthogonal direction from the substrate surface, thereby providing a free range of options for the distance between the force sensing member and the substrate. The distance from the substrate would almost only depend on the height of the bond wire loop providing for stacked configurations of the fingerprint sensor and force sensing member. The bond wire loops thus provides for a versatile electrical connection type for the force sensing member.

Accordingly, by connecting the force sensing member with bond wire loops provides improvements in the integration of the force sensing capability with the fingerprint sensor.

The electrical property that may be altered in response to a deformation may be e.g. an electrical resistance or a capacitance measured across the force sensing member. The deformation of the force sensing member may be resilient, thus the shape of the force sensing member is recovered after the force is no longer applied, whereby the electrical property is also at least partly recovered to its original state without the applied force. Accordingly, an alteration in the measured electrical property is indicative of the force applied on the force sensing member.

The electric property is measured across the first connection pad and the second connection pad forming the "plus" and "minus" poles for measuring the electrical property. An electronic measuring circuitry which may be electrically connected to the first connection pad and to the second connection pad is configured for measuring the electric property. Such an electronic measuring circuitry has the suitable electronic components to measure e.g. a voltage over (or a current flowing through) the electric connection path from the first connection pad to the second connection pad via the force sensing member. The electronic property may be determined by an application running on e.g. a mobile phone comprising the fingerprint sensing package.

A bond wire loop is formed from a bond wire which has at least one end attached to a first electrical connection pad.

The attachment provides the electrical connection of the bond wire loop to the first electrical connection pad. The second end of the bond wire may be mechanically attached to the same electrical connection pad, or to another electrical connection pad being at the same electrical potential (i.e. electrically being the same point) as the first electrical connection pad. The second end may even be connected to a dummy pad to form the bond wire loop, in such case the dummy pad is given the same electrical potential as the first connection pad through the electrical connection provided by the bond wire. It should be noted that a bond wire loop does not necessarily have to be a closed loop formed by the bond wire. However, the bond wire loop forms an upper loop portion extending away from the substrate surface. For example, the bond wire may form an arch from the bond wire which has two ends attached to the substrate.

A bond wire may be made from e.g. gold or aluminum or any other suitable bond wire material known in the art. A bond wire typically has a cross-sectional diameter in the range of 5 to 50 micro-meter.

The substrate may preferably be a printed circuit board (PCB).

According to embodiments, the bond wire loop is a first bond wire loop, wherein the fingerprint sensor package may comprise: a second bond wire loop formed from a second bond wire having two ends of which at least one end is mechanically and electrically connected to the second one of the electrical connection pads, the second bond wire loop provides the electrical connection for the force sensing member with the second electrical connection pad. Accordingly, a second bond wire loop may be included for further improved integration of the force sensing capability in the fingerprint sensor package.

In some embodiments, a first metal contact is comprised in the fingerprint sensor package to provide an electrical connection from one of the bond wire loops to the force sensing member, the first metal contact being arranged in contact with the upper portion of the bond wire loop. The metal contact is advantageous for improved electrical contact between the force sensing member and the bond wire loop. In addition, the metal contact is particularly advantageous for capacitive read out of the force sensing member, whereby the metal contact may serve as a first metal plate for the capacitive read out.

In some embodiments, the metal contact may be provided in the form of a bezel. The bezel may serve functions associated with the fingerprint sensor, such as to provide a ground connection for the finger or to provide a drive signal to the finger during fingerprint sensing. The bezel may also be a separate bezel serving only as a metal contact.

According to embodiments of the invention, the fingerprint sensor package may comprise a molding material covering at least the top surface of the substrate, the fingerprint sensor, and a portion of each of the bond wire loops, wherein the upper portion of at least one bond wire loop is accessible near the molding material outer surface, wherein said force sensing member is connected to said bond wire loop at said upper portion of the at least one bond wire loop. Accordingly, the bond wire loops are accessible near the surface of the molding material such that they may be electrically contacted as the molding material surface. Near the surface should be interpreted as that the bond wire loop upper portion may initially be partly covered by the molding material, whereby part of the molding material may have to be removed to access the bond wire loop upper portion. Alternatively or additionally the bond wire loops may for example be arranged higher than the molding material surface such that they are visible after the molding step. The mold provides a stable mechanical support for the bond wire loops such that they may be reliable electrically connected at their upper portions.

In one embodiment, the upper portion of the at least one bond wire loop is accessible in a cavity formed in the molding material, wherein the force sensing member is arranged in the cavity. In other words, a cavity may be formed by e.g. laser etching, such as to expose the bond wire loop. The first metal contact may in this case be arranged in the cavity in order to electrically contact the bond wire loop exposed in the cavity. It may often occur that the bond wire loops are not possible to electrically connect to at the surface of the molding material after the molding step. Therefore, a step of exposing the bond wire loops is advantageously included.

Furthermore, the upper portion of at least the second bond wire loop is accessible in a second cavity formed in the molding material surface, wherein the force sensing member electrically connected to the second bond wire loop in the second cavity with a second metal contact.

The force sensing member may for example comprise quantum tunneling composite (QTC) material. A QTC material comprises metal particles embedded in a polymer whereby the electrical resistance through the QTC-comprising member is altered when the QTC-comprising is deformed, the alteration of the electrical property is due to that the distance between the metal particles embedded in the polymer is altered when the QTC-comprising member is deformed. The force sensing material may alternatively comprise a piezoelectric material (e.g. PVDF, BiTi, BaTi, etc.).

The force sensing member may alternatively be comprised of a metal arranged in a way that the resistance through the metal responds to a change in force, ie a strain guage. In other words, the force sensing member may provide a measureable electrical property which is alterable in response to a mechanical deformation of the member which thus provides an indication of the force applied to the force sensing member. Both QTC materials and piezoelectric-comprising member are per se well known in the art of making force sensing members.

According to a second aspect of the present invention, there is provided an electronic device comprising the fingerprint sensor package according to anyone of the above embodiments.

Accordingly, the fingerprint sensing package preferably forms part of an electronic device further comprising a device controller for performing an authentication of the finger based on the acquired verification fingerprint image and verification force value, and performing at least one action only if the authentication indicates an authentication success. Such an action may for example be for unlocking a locked portable device, e.g. in case the portable device is a mobile phone. The action may of course be any type of action suitably used when there is a need to authenticate a finger.

This second aspect of the invention provides similar advantages as discussed above in relation to the previous aspect of the invention.

According to a third aspect of the invention there is provided a method for manufacturing a fingerprint sensor package comprising a fingerprint sensor on a substrate having a plurality of connection pads on the substrate, the fingerprint sensor being connected to at least one of the electrical connection pads, the method comprising: forming a bond wire loop from a bond wire, the bond wire loop being formed by two ends of the bond wire, wherein at least one of the ends is mechanically and electrically attached to a first one of the electrical connection pads, arranging a force sensing member in electrical contact with the first electrical connection pad via an upper portion of the bond wire loop and in electrical contact with a second one of the electrical connection pads different from the first electrical connection pad connected with the bond wire loop, wherein an electrical property of the force sensing member is alterable in response to a deformation of the force sensing member, wherein the alternation of the electrical property is measureable across the electrical connection between the first electrical connection pad and the second electrical connection pad.

Advantageously, the fingerprint sensor is connected to the at least one of the electrical connection pads with at least one bond wire, wherein the bond wire loop and the bond wire connections for the fingerprint sensor are formed in the same wire bonding step. The same wire bonding step should be interpreted as that the wire bonds for the fingerprint sensor and the bond wire loops may be bonded with the same wire bonding apparatus without having to remove the substrate from the wire bonding apparatus between the wire bonding of the fingerprint sensing and forming the bond wire loops. However, the substrate may of course be intermediately removed if needed and even be placed in a different wire bonding tool if desirable. Both cases (remove or not remove the substrate) are within the scope of the invention.

According to embodiments of the invention, there may be included to form a second bond wire loop from a second bond wire having two ends, wherein at least one of the ends is attached to the second one of the electrical connection pads, the second bond wire loop provides the electrical connection for the force sensing member with the second electrical connection pad.

According to embodiments of the invention, there may be included to form a first metal contact to provide an electrical connection from one of the bond wire loops to the force sensing member.

According to yet another embodiment, there may be included to apply a molding material covering at least the top surface of the substrate, the fingerprint sensor, and a portion of each of the bond wire loops.

According to yet another embodiment, there may be included to open a cavity in the molding material such as to access the upper portion of the bond wire loop, wherein the force sensing member is arranged in the cavity in electrical contact with the accessible bond wire loop.

According to yet another embodiment, there may be included to form the first metal contact in the cavity, and arrange the force sensing member in the cavity, and in contact with the first metal contact for connecting the force sensitive member to the exposed bond wire loop in the cavity.

According to yet another embodiment, the force sensing member may be attached to a protective plate, wherein the method comprises: arranging the protective plate on the molding material such that the force sensing member makes electrical contact with the exposed bond wire loop.

This third aspect of the invention provides similar advantages as discussed above in relation to the previous aspect of the invention.

The fingerprint sensor may be implemented using any kind of current or future fingerprint sensing principle, including for example capacitive, optical, or thermal sensing technology. However, at present capacitive sensing is most preferred. With a capacitive fingerprint sensor, a measure is detected indicative of the capacitive coupling between each sensing element in an array of sensing elements and a finger surface touching the fingerprint sensor surface. Sensing elements at locations corresponding to ridges in the fingerprint will exhibit a stronger capacitive coupling to the finger than sensing elements at locations corresponding to valleys in the fingerprint. Both one and two-dimensional sensors are possible and within the scope of the invention. Furthermore, the electronic device may advantageously be a mobile phone. However, other electronic devices are of course thinkable such as tablets, laptops desktop computers, smart cards, electronic locks, vehicle applications, etc.

In summary, the present invention generally relates to a fingerprint sensor package comprising: a substrate having thereon a plurality of electrical connection pads; a fingerprint sensor arranged on the substrate and electrically connected to at least one of the electrical connection pads; a bond wire loop formed from a bond wire having two ends of which at least one end is mechanically and electrically attached to a first one of the electrical connection pads, and a force sensing member in electrical contact with the first electrical connection pad via an upper portion of the bond wire loop, and in electrical contact with a second one of the electrical connection pads different from the first electrical connection pad, wherein an electrical property of the force sensing member is alterable in response to a deformation of the force sensing member.

Further features of, and advantages with, the present invention will become apparent when studying the appended claims and the following description. The skilled addressee realize that different features of the present invention may be combined to create embodiments other than those described in the following, without departing from the scope of the present invention.

BRIEF DESCRIPTION OF THE DRAWINGS

The various aspects of the invention, including its particular features and advantages, will be readily understood from the following detailed description and the accompanying drawings, in which:

FIG. 5b is a cross-sectional view of the fingerprint sensor package shown in FIG. 5a;

FIG. 7b is a cross-sectional view of the fingerprint sensor package shown in FIG. 7a;

FIG. 8 conceptually shows a fingerprint sensor package according to an embodiment of the invention;

DETAILED DESCRIPTION

Figure 1:
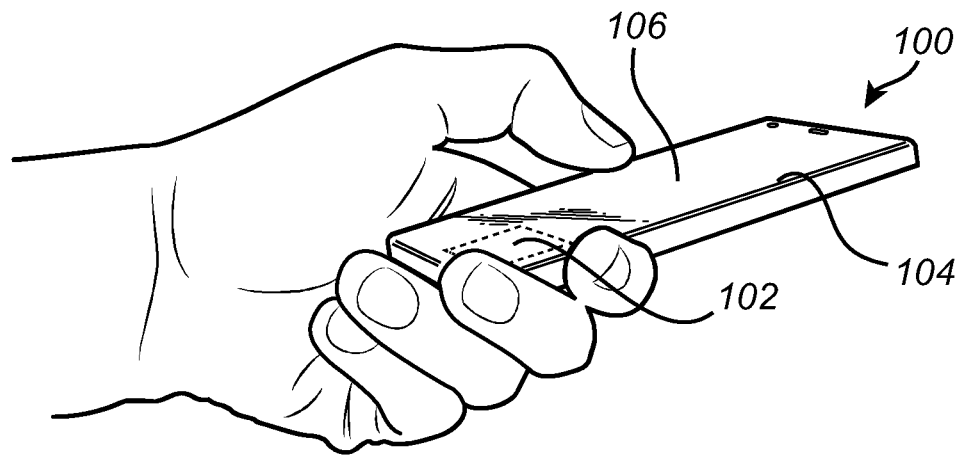
FIG. 1 schematically exemplifies an electronic device according to the present invention, in the form of a mobile phone comprising an integrated fingerprint sensor.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

Turning now to the drawings and to FIG. 1 in particular, there is schematically illustrated the electronic device according to the present invention, in the form of a mobile phone 100 with an integrated fingerprint sensor 102 and a display unit 104 with a touch screen interface 106. In this embodiment the fingerprint sensor 102 and the display unit 104 are together arranged at the front side of the mobile phone 100. The fingerprint sensor 102 may, for example, be used for unlocking the mobile phone 100 and/or for authorizing transactions carried out using the mobile phone 100, etc. The fingerprint sensor 102 may of course also be placed on the backside or the side of the mobile phone 100.

Preferably and as is apparent for the skilled person, the mobile phone 100 shown in FIG. 1 further comprises a first antenna for WLAN/Wi-Fi communication, a second antenna for telecommunication communication, a microphone, a speaker, and a phone control unit. Further hardware elements are of course possibly comprised with the mobile phone. It should furthermore be noted that the invention may be applicable in relation to any other type of portable electronic device, such as a laptop, a remote control, a tablet computer, or any other type of present or future similarly configured device.

Figure 2:
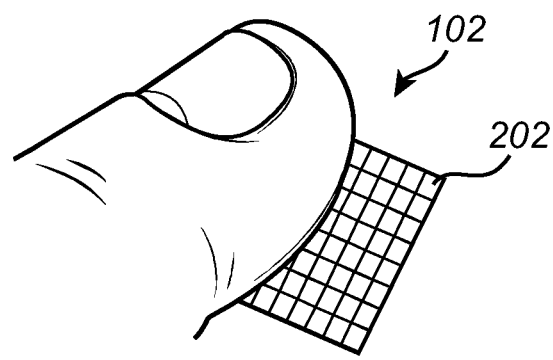
FIG. 2 schematically shows the fingerprint sensor array comprised in the electronic device in FIG. 1.

With reference to FIG. 2, there is conceptually illustrated a somewhat enlarged view of the fingerprint sensor 102. In the case of employing a capacitive sensing technology, the fingerprint sensor 102 is configured to comprise a large plurality of sensing elements, preferably arranged as a two-dimensional array. The two-dimensional array may have sizes depending on the planned implementation and in an embodiment 160×160 pixels are used. Other sizes are of course possible and within the scope of the invention, including two-dimensional array with less or more pixels as compared to the above example. A single sensing element (also denoted as a pixel) is in FIG. 2 indicated by reference numeral 202.

Figure 3:
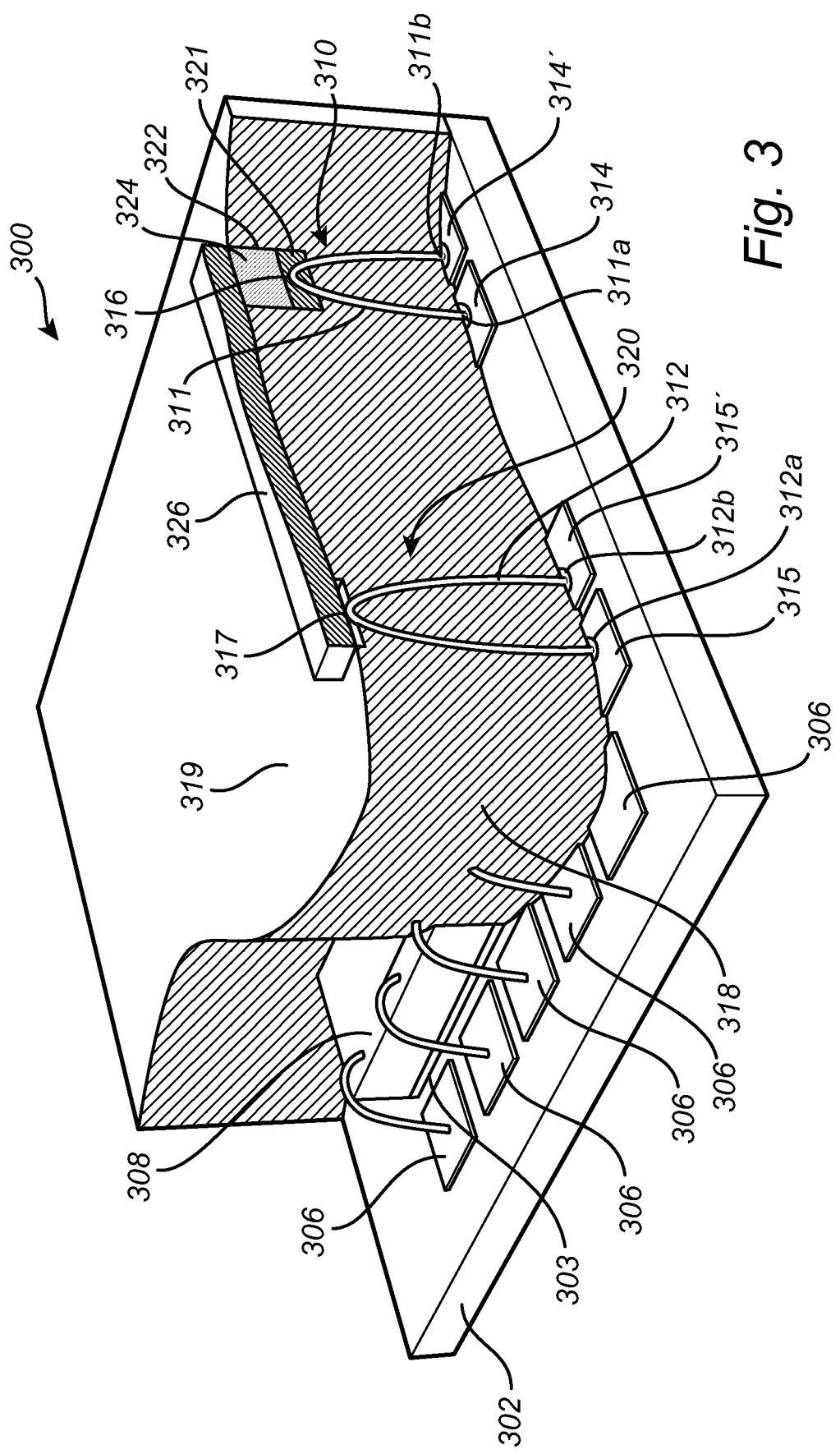
FIG. 3 conceptually shows a fingerprint sensor package according to an embodiment of the invention.

FIG. 3 shows a partly cut cross-sectional view of a fingerprint sensor package 300 according to an embodiment of the invention. The fingerprint sensor package 300 comprises a substrate 302 which has a plurality of electrical connection pads 306 arranged thereon. The electrical connection pads 306 may be gold pads. A fingerprint sensor 308 is arranged on the substrate 302 and is electrically connected to at least one of the electrical connection pads 306 via respective bond wires. The fingerprint sensor 308 may for example be attached to the substrate 302 using a die attach film 303, e.g. type of glue. There is further shown a bond wire loop 310 formed from a bond wire 311 which has two ends, 311a and 311b. One of the ends 311a is mechanically attached to a first electrical connection pad 314 to make electrical contact with the connection pad 314. The second end 311b is here shown to be attached to a further pad connection pad 314' such that a bond wire loop 310 is formed. The upper portion 316 of the bond wire loop 310 extends away from the surface of the substrate 302. The second end 311b may be attached to other places than to the connection pad 314', as long as the second end portion 311a attachment point is at the same electrical potential as the first connection pad. The further connection pad 314' may be dummy pad as long as the bond wire loop is formed that extends with a upper portion 316 away from the surface of the substrate 302. In other embodiments the first end 311a and the second end 311b are attached to the same connection pad, e.g. connection pad 314.

In the particular embodiment shown in FIG. 3, a molding material 318 has been applied which covers the fingerprint sensor 308 and the substrate 302. The molding material may be an epoxy compound or similar. The molding material may be applied with a thickness of about 30 to 200 micrometer. The bond wire loop 310 is accessible at the surface of the molding material and a second bond wire loop 320 is also accessible at the surface 319 of the molding material in a cavity 322 formed in the molding material. The second bond wire loop 320 is formed from a bond wire 312 having two ends 312a, 312b of which a first 312a end is mechanically and electrically connected to a second electrical connection pad 315 of the electrical connection pads and the second end 312b is attached to a further electrical connection pad 315' to form a bond wire loop in a similar manner as the first bond wire loop 310.

Figure 11:
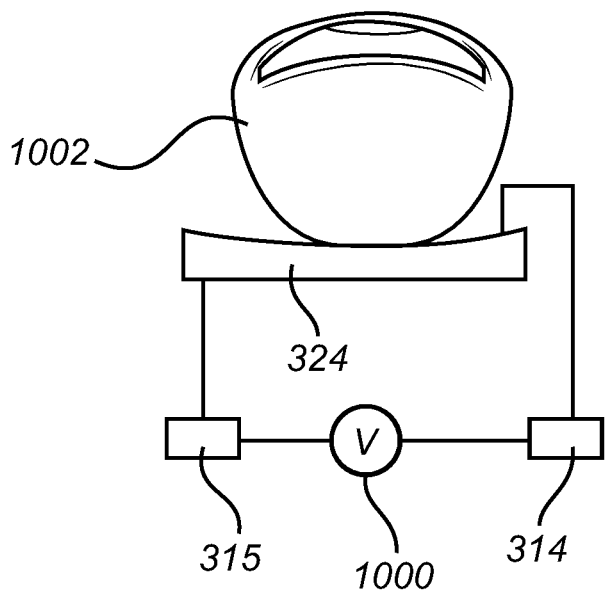
FIG. 11 conceptually illustrates deformation of the force sensing member and measuring an electronic property of the force sensing member.

The cavity 322 has a depth such that the first bond wire loop 310 is exposed and can be electrically contacted with a first metal contact 321 arranged in the cavity 322. The exposed part of the bond wire loop 310 is at least part of the upper portion 316. In addition, a force sensing member 324 is located at least partly in the cavity 322 and in electrical contact with the first electrical contact 321 in the cavity 322. A second metal contact 326 is arranged in electrical contact with the force sensing member 324 and with the second bond wire loop 320 also accessible at from the upper surface 319 of the molding material 318. The second bond wire loop 320 is not exposed in a cavity but may in other embodiments be exposed in a cavity in a similar manner as the first bond wire loop 310. The second metal contact 326 provides an electrical connection from the second bond wire loop 320 to the force sensing member 324. Thus, an electrical property of the force sensing member 324 may in this way be measured by an electronic measuring circuit (not shown) electrically connected to the first connection pad 314 and the second connection pad 315 which provides an electrical measurement path through the force sensing member 324. As is conceptually illustrated in FIG. 11, when the force sensing member 324 is exposed to a force (e.g. caused by a finger 1002 pressing on the fingerprint sensor package), an electrical property (e.g. resistance, capacitance, etc) is altered wherein a signal indicative of this alternation is measurable across the electrical connection from the first connection pad 314 to the second connection pad 315 by an electronic measuring circuit 1000. The signal may for example be a change in a measured voltage in response to a change in resistance of the force sensing member 324.

Figure 4A:
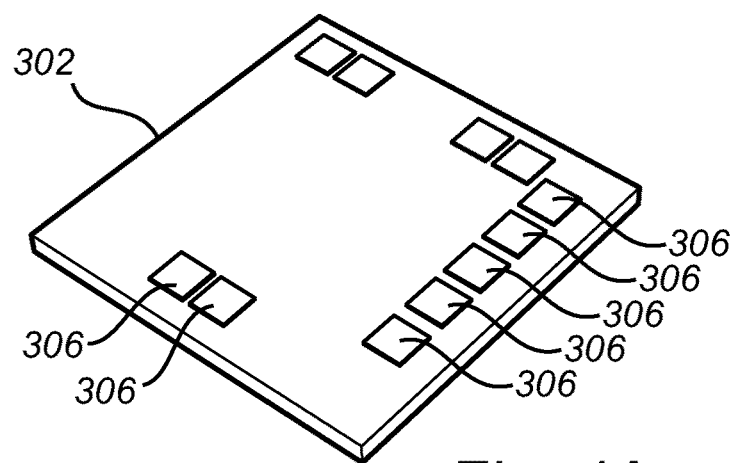
FIGS. 4a-4h schematically illustrates a process flow for manufacturing the embodiment shown in FIG. 3.
Figure 4B:
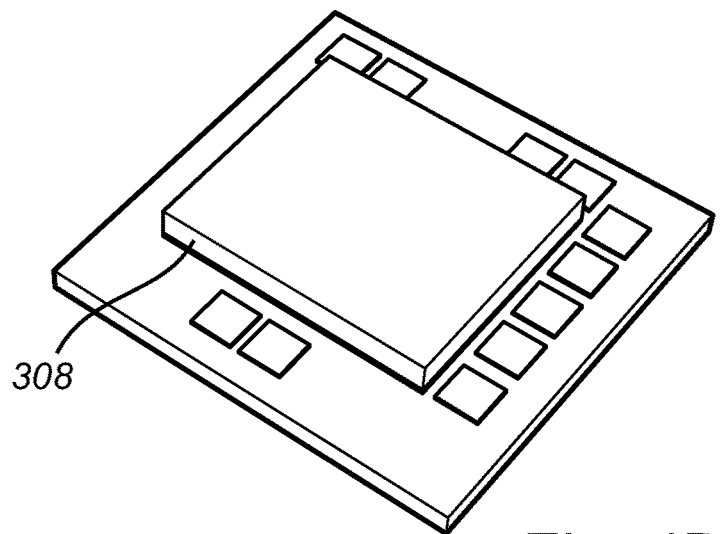
Figure 4C:
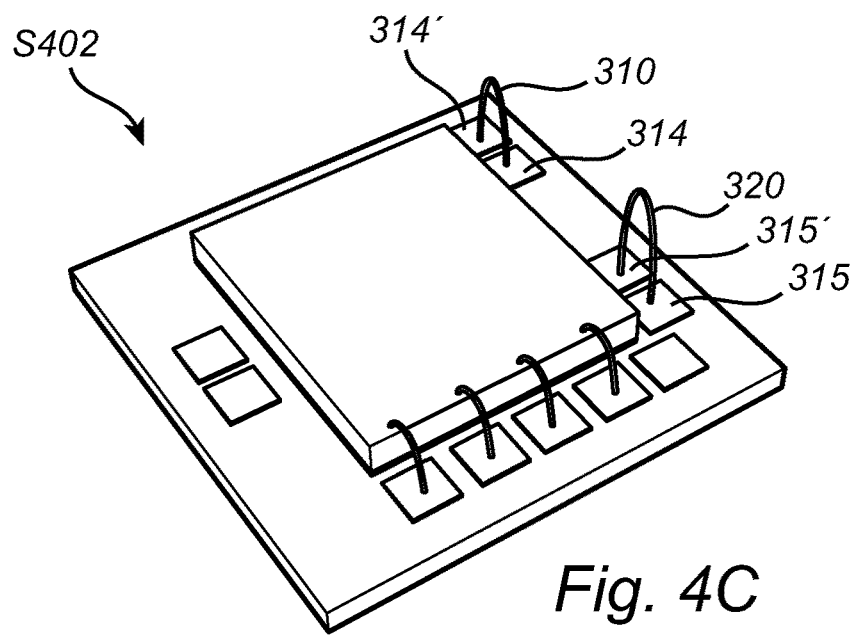
Figure 4D:
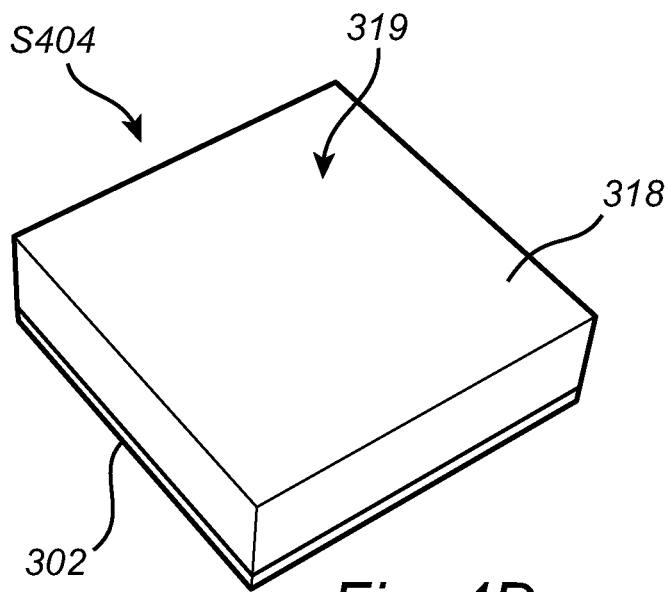
Figure 4E:
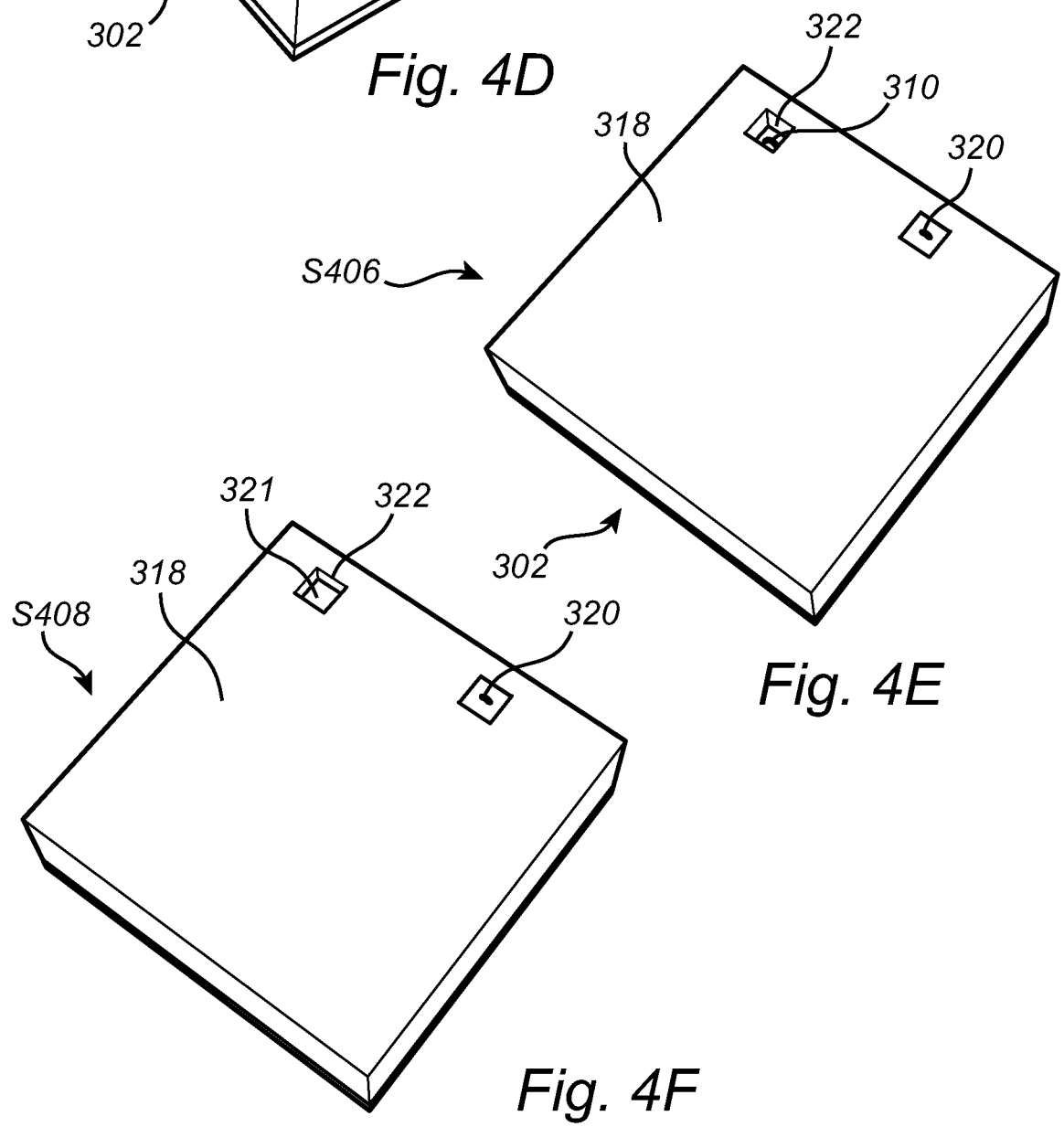
Figure 4F:
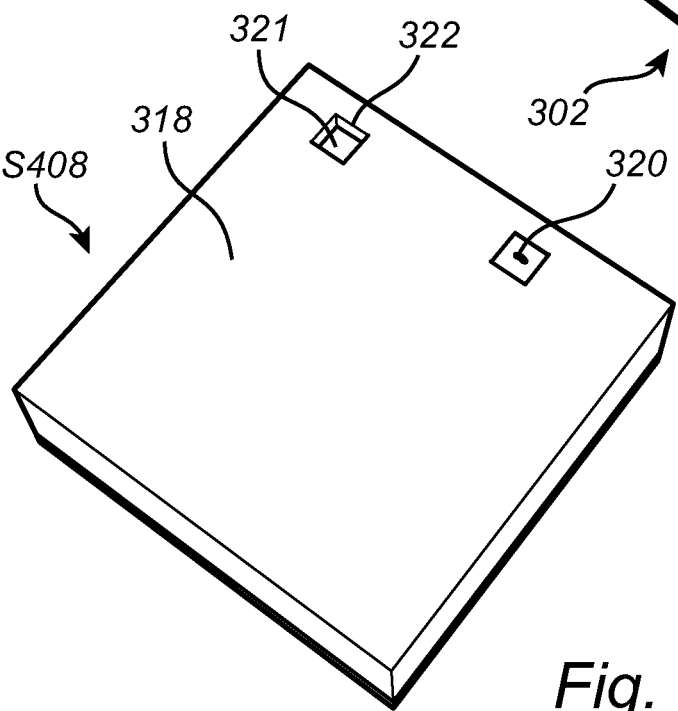
Figure 4G:
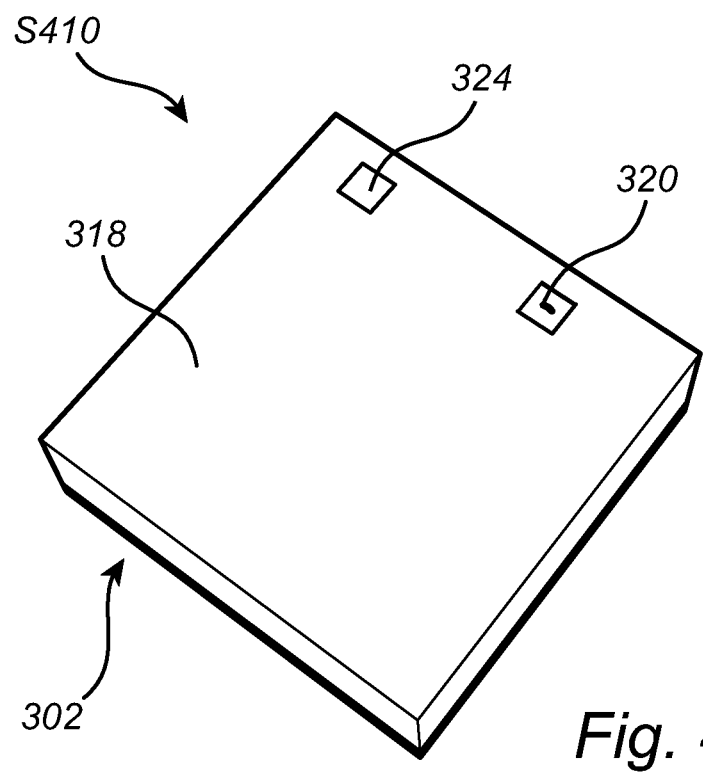
Figure 4H:
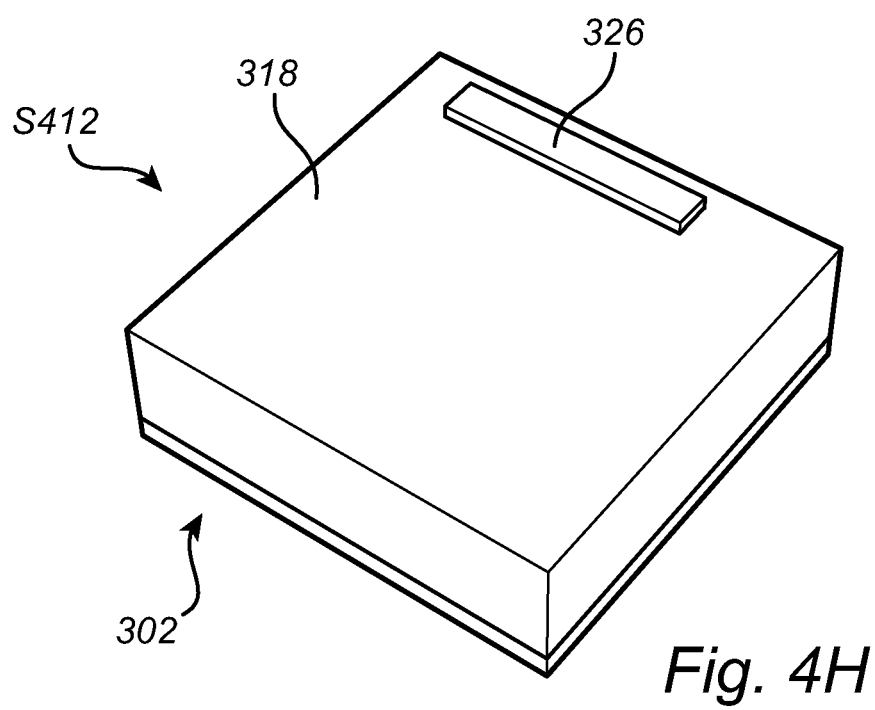

FIG. 4a-h schematically illustrates a process flow for manufacturing the embodiment shown in FIG. 3. Starting from a substrate such as a printed circuit board (PCB) having a plurality of electrical connection pads thereon as shown in FIG. 4a. A fingerprint sensor 308 is arranged on the substrate 302 (FIG. 4b). In a wire bonding step S402 (FIG. 4c), the fingerprint sensor 308 is electrically connected to at least one of the electrical connection pads 306. Additionally, and preferably in the same wire bonding step, a first bond wire loop 310 is formed in electrical and mechanical connection with a first connection pad 314 (314') and a second bond wire loop 320 is formed in electrical and mechanical connection with a second connection pad 315 (315').

A molding material is applied S404 (FIG. 4d) which covers the substrate and the fingerprint sensor and in this case the bond wire loops 310 and 320. In order to access the first bond wire loop 310 from the upper surface side 319 of the molding material, a cavity 322 is formed S406 (FIG. 4e) in the molding material 318. The second bond wire loop 320 is also accessed at the surface of the molding material, either in a cavity or at the top surface of the molding material without a cavity.

A first metal contact 321 is formed S408 (FIG. 4f) in the cavity 322 in electrical contact with the first bond wire loop 310 by metallizing the bottom of the cavity 322. A force sensing member 324 is arranged S410 (FIG. 4g) onto the first metal contact 321 to make electrical contact with the first metal contact 321 and thus also the first bond wire loop 310. The force sensing member may be deposited in cases where it is possible, for example in the case of a QTC force sensing member or a piezoelectric force sensing member. Subsequently S412 (FIG. 4h), a second metal contact 326 is added which makes electrical contact with the force sensing member 324 and the second bond wire loop 320.

Figure 5A:
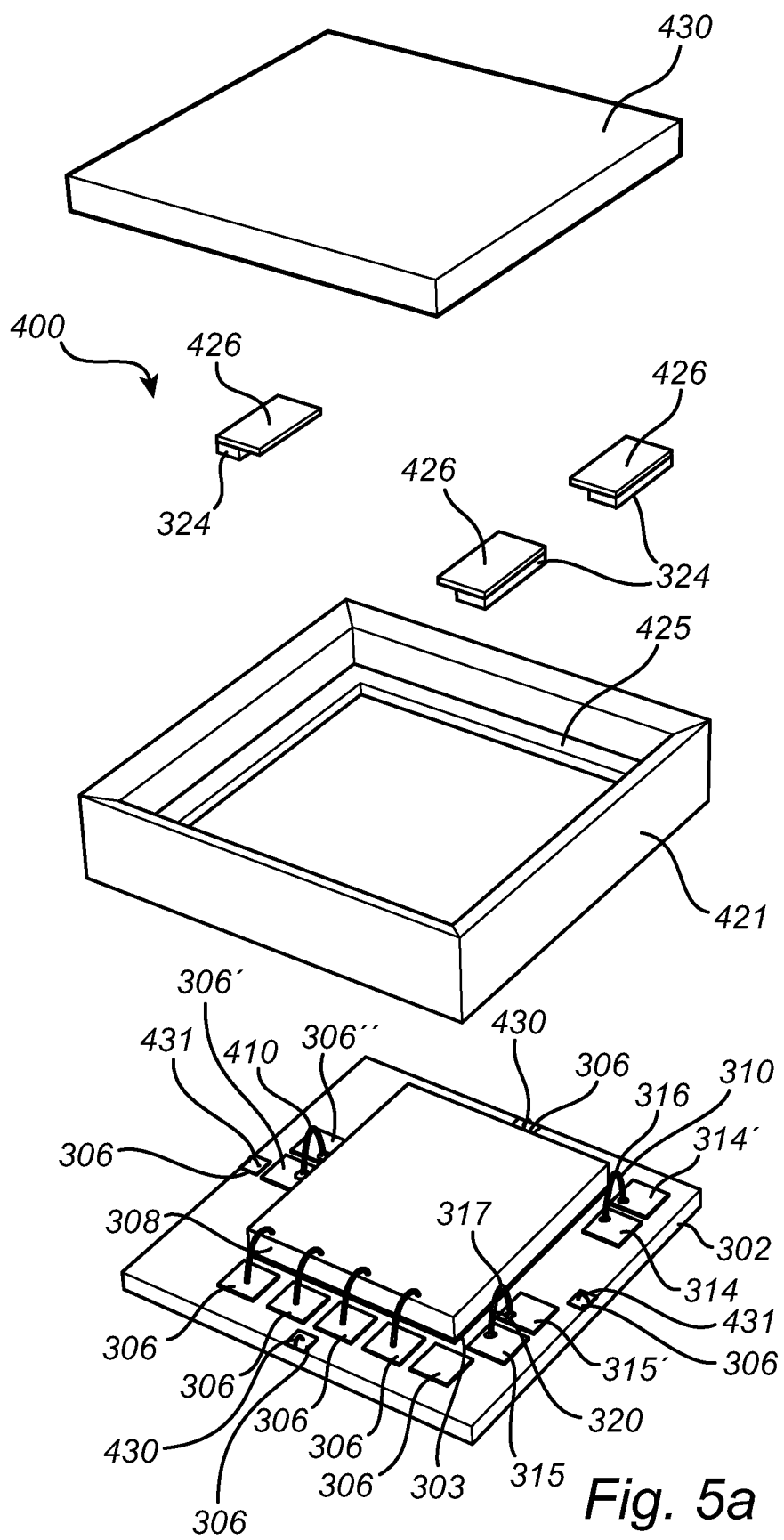
FIG. 5a is an exploded view of another fingerprint sensor package according to an embodiment of the invention.
Figure 5B:
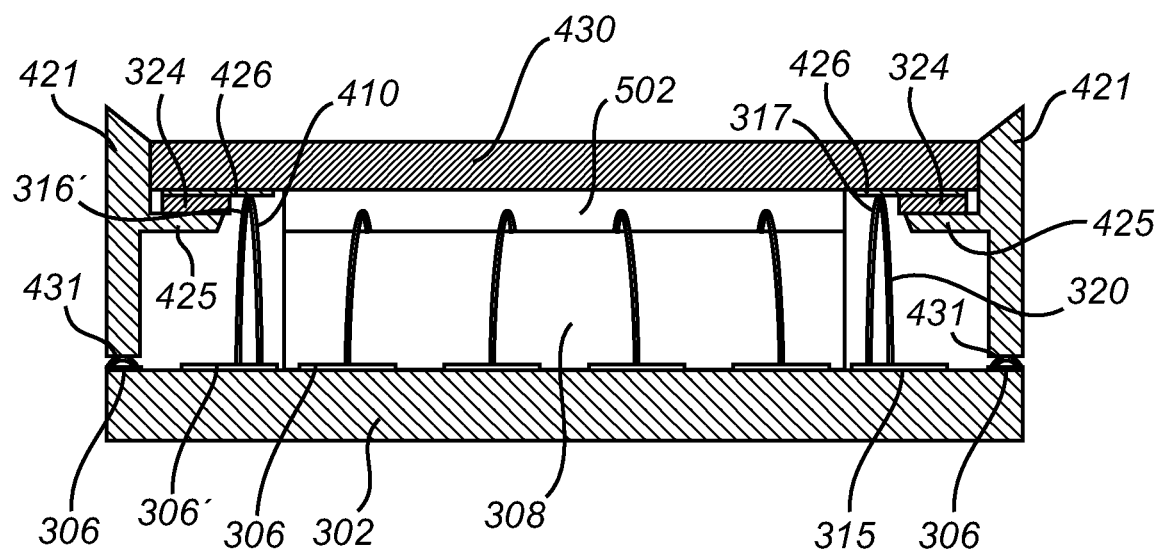

FIG. 5a shows an exploded view of another fingerprint sensor package 400 according to an embodiment of the invention and FIG. 5b shows a cross-sectional view of the fingerprint sensing package shown in FIG. 5a. FIG. 5a and FIG. 5b will now be described in conjunction with each other. The fingerprint sensor package 400 comprises a substrate 302 which has a plurality of electrical connection pads 306 arranged thereon. The electrical connection pads 306 may be gold pads. A fingerprint sensor 308 is arranged on the substrate 302 and is electrically connected to at least one of the electrical connection pads 306. Similar to the embodiment described with reference to FIGS. 3 and 4a-h, a first bond wire loop 310 is formed in and is in electrical and mechanical connection with a first connection pad 314 (314') and a second bond wire loop 320 is formed and is in electrical and mechanical connection with a second connection pad 315 (315'). In the embodiment conceptually shown in FIGS. 5a-b a first metal contact 421 is provided in the form of a metal bezel 421 arranged around the peripheral portion if the substrate and in electrical contact with the first bond wire loop 310. The bezel 421 may for example serve other functions than being a metal contact, for example the bezel may provide a ground connection for a finger during a fingerprint sensing operation, or it may serve to provide a drive signal to the finger during such an operation depending on the type of fingerprint sensing technique that is employed.

A force sensing member 324 is arranged in electrical contact with the bezel 421. In the embodiment shown in FIG. 5, the force sensing member 324 is arranged in contact with a protrusion of the bezel forming a ledge 425. A second metal contact 426 is arranged in electrical contact with the force sensing member 324 and in mechanical and electrical contact with the upper portion 317 of the second bond wire loop 320 which is attached to the second connection pad 315. In the presently illustrated example embodiment, there are three force sensing members (each numbered 324). The multiple force sensing members 324 enables to implement e.g. navigation functions since it is possible to determine on which side of the fingerprint sensing package the force is applied. Thereby, the determined side may be associated with a navigation direction.

In the cross-sectional view in FIG. 5b, there is shown a bond wire loop 410 in electrical and mechanical contact with an electrical contact pad 306'. An upper portion 316' of the bond wire loop 410 is in contact with the metal contact 426 which is in contact with the force sensing member 324. The force sensing member 324 is in contact with the bezel 421.

There are further shown bond wire loops 431 which are formed on a respective pad 306. The bond wire loops 431 are configured to make electrical contact with the bezel 421 for providing an electrical connection to the force sensing member 324. The bond wire loops provide improved mechanical pressure on the bezel such that the electrical connection is more robust compared to only arranging the bezel directly on a connection pad 306.

Furthermore, an adhesive 502 has been applied for mechanically attaching a protective plate 430 and the fingerprint sensor die 308. The adhesive 502 has a thickness which is larger than the bond wire loop height to avoid that the bond wire comes into contact with the protective plate 430. The adhesive may comprise several layers or a single layer. Suitable adhesives are described in U.S. Pat. No. 9,576,177 hereby incorporated by reference.

Other alternative adhesives 502 may be of a type similar to the adhesive 303 applicable as a die attach film. In such case the adhesive may be applied in a a relatively thin layer, such as about 10 micrometer. This is particularly advantageous in case of recessed electrical connection pads (for electrical connection pads 306, 314, 314', 315, 315'), or in the case of through-silicon-vias interconnects for the pads.

A protective plate may be constitute any type of insulating material such as a ceramic material, SiO2, ZrO2, sapphire or chemically strengthened glass which is suitable for use as a top layer forming a surface in a fingerprint sensing device.

Figure 6A:
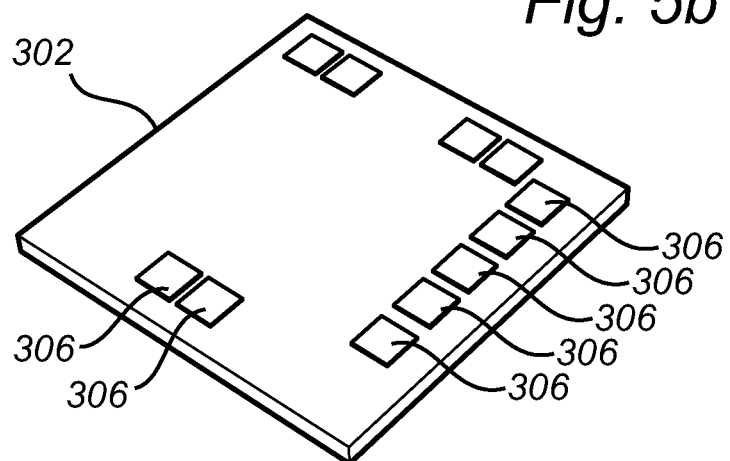
FIG. 6a-f schematically illustrates a process flow for manufacturing the embodiment shown in FIG. 5a-b.
Figure 6B:
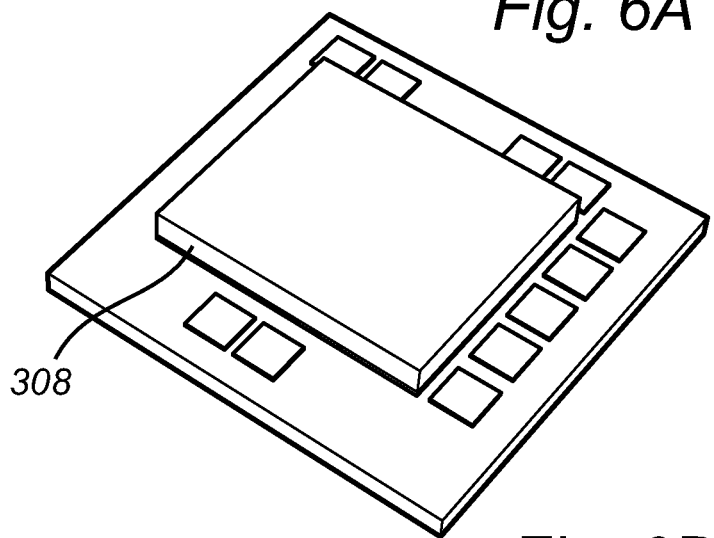
Figure 6C:
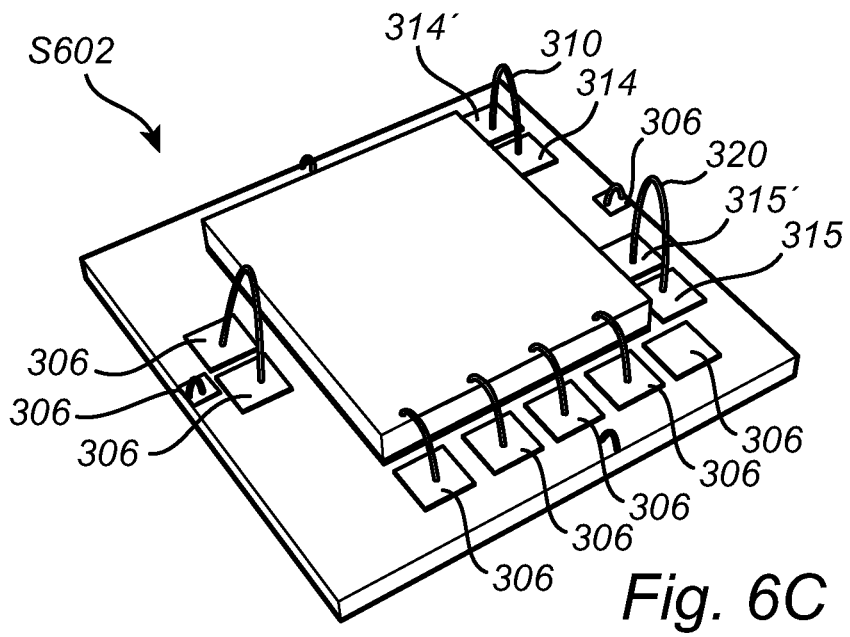
Figure 6D:
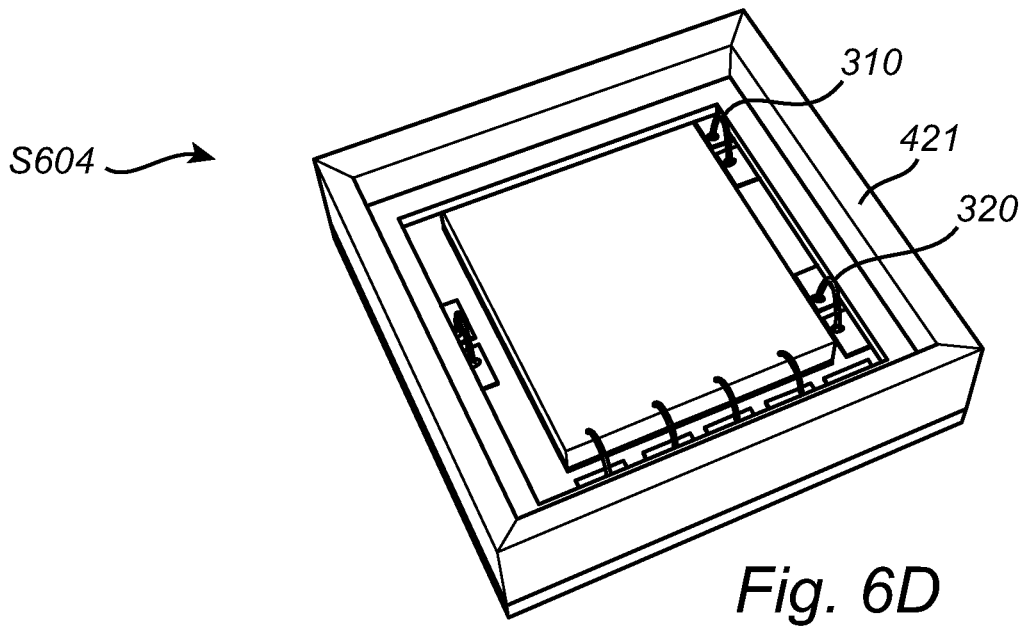
Figure 6E:
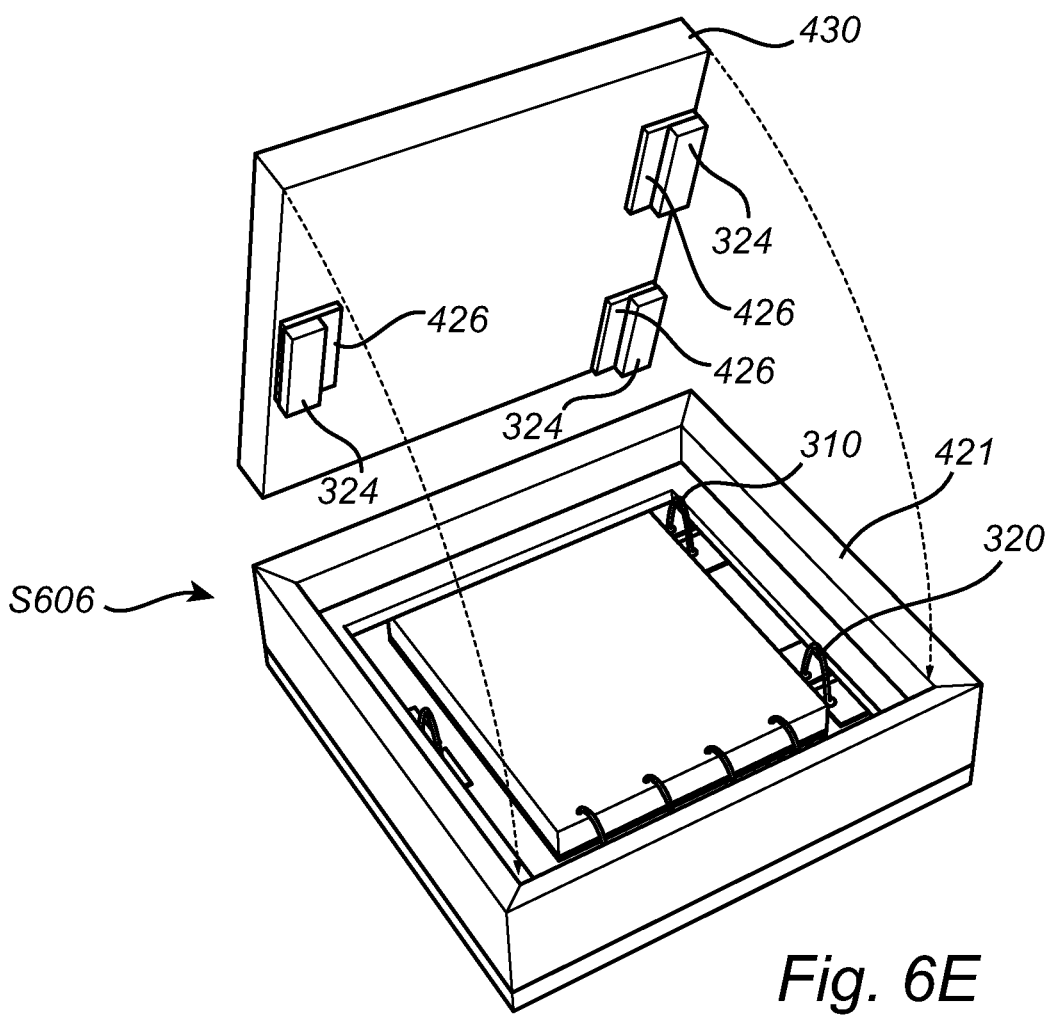
Figure 6F:
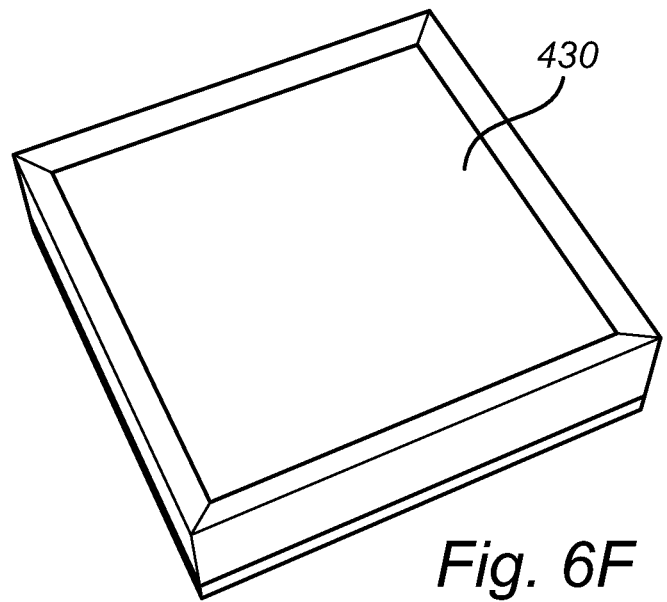

FIG. 6a-h schematically illustrates a process flow for manufacturing the embodiment shown in FIG. 5a-b. Starting from a substrate 302 such as a printed circuit board (PCB) having a plurality of electrical connection pads thereon (FIG. 6a). A fingerprint sensor 308 is arranged on the substrate 302 (FIG. 6b). In a wire bonding step S602 (FIG. 6c), the fingerprint sensor 308 is electrically connected to at least one of the electrical connection pads 306. Additionally, and preferably in the same wire bonding step, a first bond wire loop 310 is formed in and is in electrical and mechanical connection with a first connection pad 314 (314') and a second bond wire loop 320 is formed and is in electrical and mechanical connection with a second connection pad 315 (315'). Next, S604 (FIG. 6d), a metal bezel 421 is arranged in contact with at least the first bond wire loop 310. Subsequently S606 (FIG. 6e-f), a protective plate 430, e.g. a glass plate, which has the force sensing member 324 and a second metal contact 426 attached to it is arranged such that the force sensing member 324 is connected to the metal bezel 421 and the second metal contact 426 is in contact with the upper portion 317 of the second bond wire loop 320. The force sensing member 324 and the second metal contact 426 are electrically connected to each other on the protective plate 430 (for example a glass plate). When the force sensing member 324 is exposed to a force, an electrical property (e.g. resistance, capacitance, etc.) is altered wherein a signal indicative of this alternation is measurable across the electrical connection from the first connection pad 314 to the second connection pad 315.

Figure 7A:
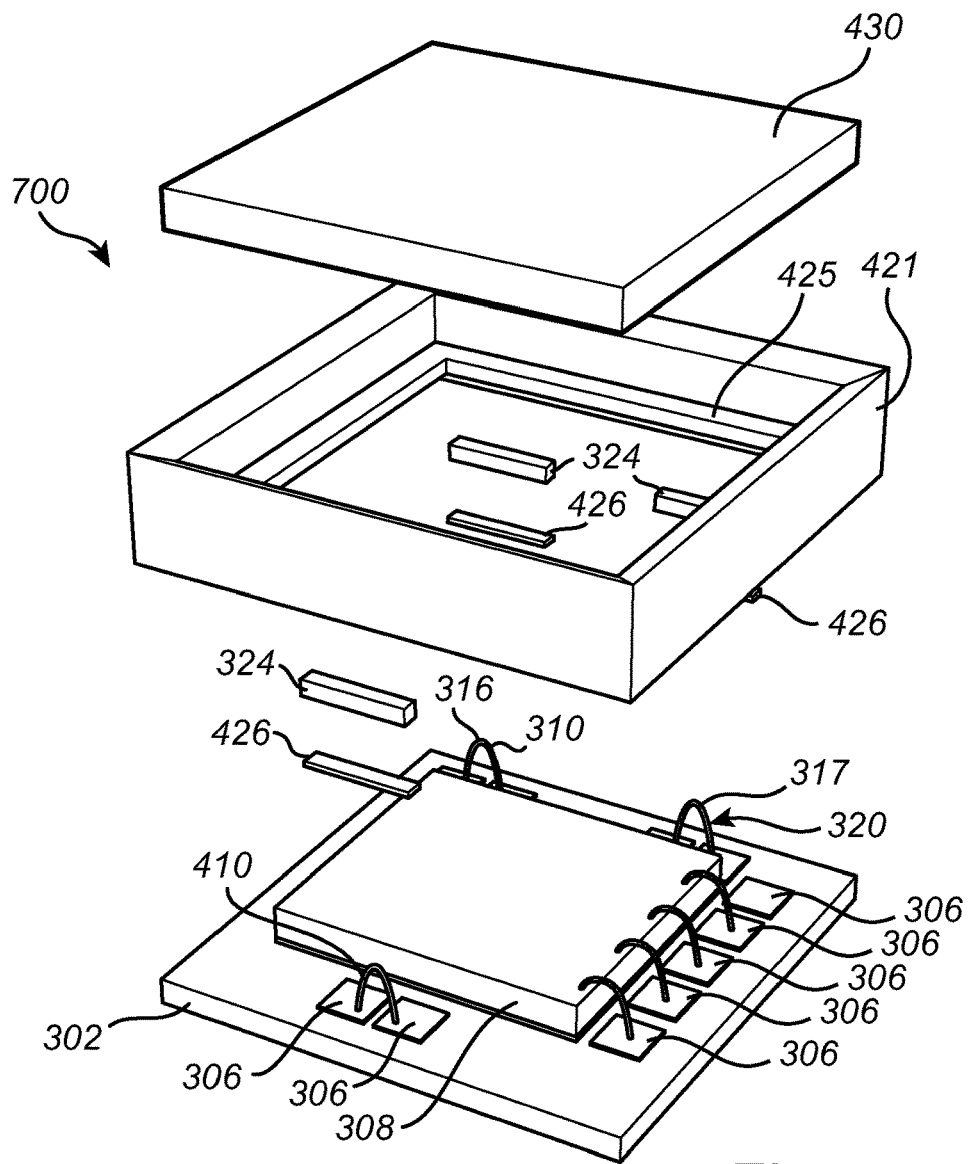
FIG. 7a is an exploded view of another fingerprint sensor package according to an embodiment of the invention.
Figure 7B:
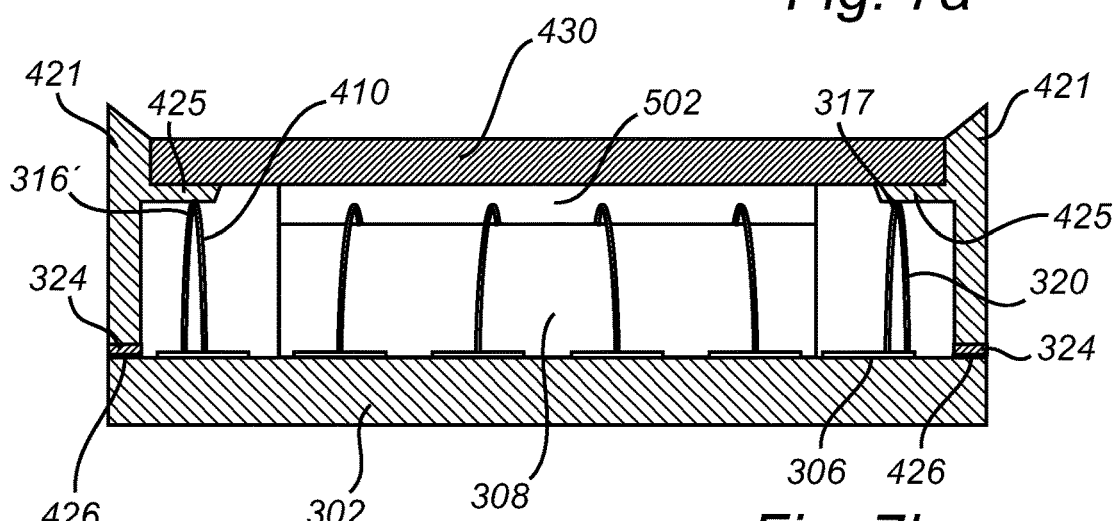

In another embodiment of the fingerprint sensor package 700 the force sensing member 324 is arranged on an underside of the metal bezel 421 as is shown in the exploded view in FIG. 7a and in the cross-sectional view in FIG. 7b. In this embodiment, the force sensing member 324 may be directly deposited onto an electrical connection pad 426 serving as a second metal contact prior to mounting of the metal bezel 421, i.e. the force sensing member 324 is interleaved between the bezel 421 and the electrical connection pad 426. The metal bezel 421 still serves as a first metal contact in contact with the force sensing member 324 and with a upper portion 316 of a first bond wire loop 310. Similarly to the embodiment shown in FIG. 5a-b, there are multiple force sensing members (each numbered 324) also in the presently described embodiment.

FIG. 8 is a partly cut away cross-sectional view of another embodiment of the invention. The fingerprint sensor package 600 comprises a substrate 302 which has a plurality of electrical connection pads 306 arranged thereon. The electrical connection pads 306 may be gold pads. A fingerprint sensor 308 is arranged on the substrate 302 and is electrically connected to at least one of the electrical connection pads 306. A first bond wire forming a first bond wire loop 310 is mechanically and electrically attached to a first connection pad 314 and a second bond wire forming a second bond wire loop 320 is mechanically and electrically attached to a second connection pad 315. A force sensing member 324 is in contact with a upper portion 316 of the first bond wire loop 310 and with a upper portion 317 of the second bond wire loop 320. Thus, an alteration of an electrical property of the force sensing member 324 may be measured across the first electrical connection pad 314 and the second electrical connection pad 315.

Figure 9A:
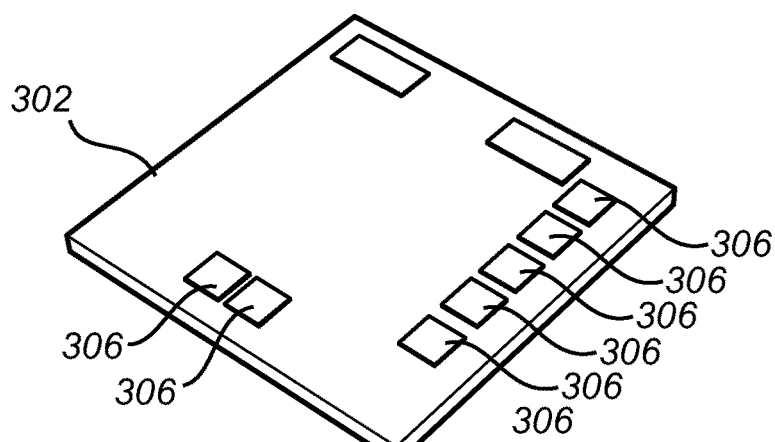
FIG. 9a-f schematically illustrates a process flow for manufacturing the embodiment shown in FIG. 8.
Figure 9B:
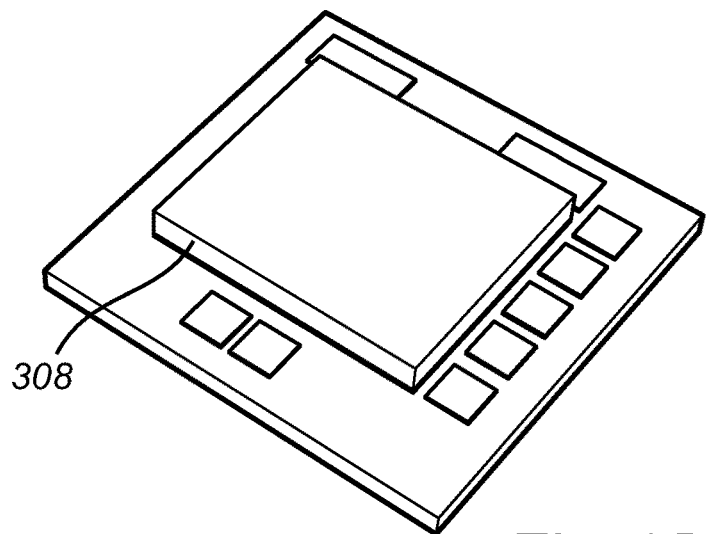
Figure 9C:
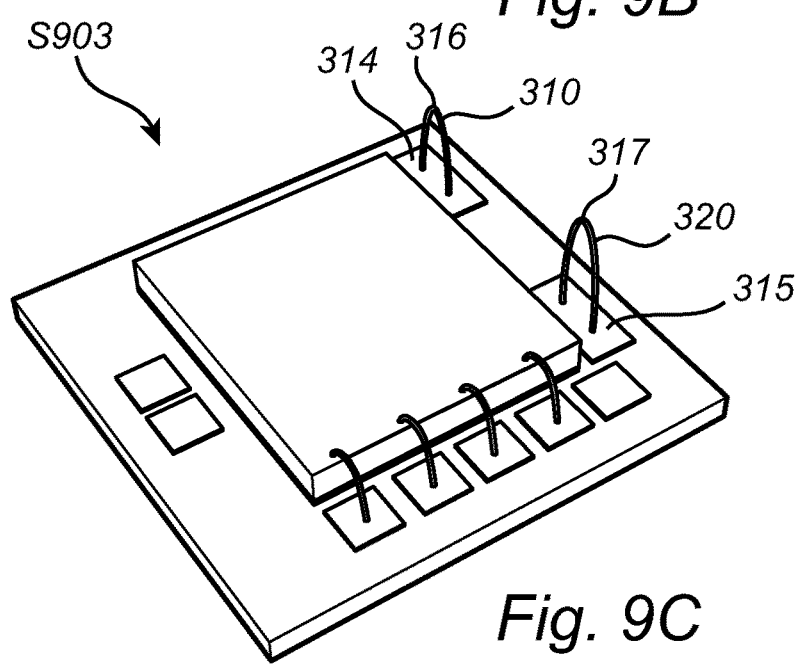
Figure 9D:
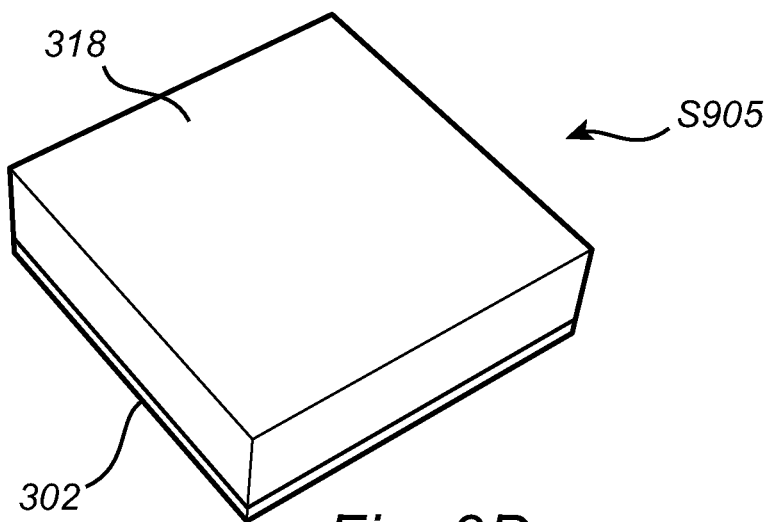
Figure 9E:
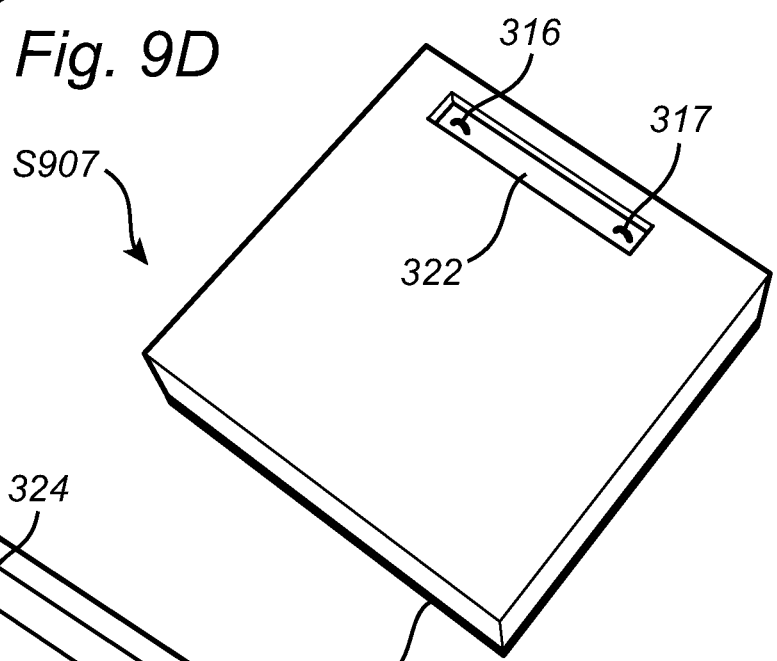
Figure 9F:
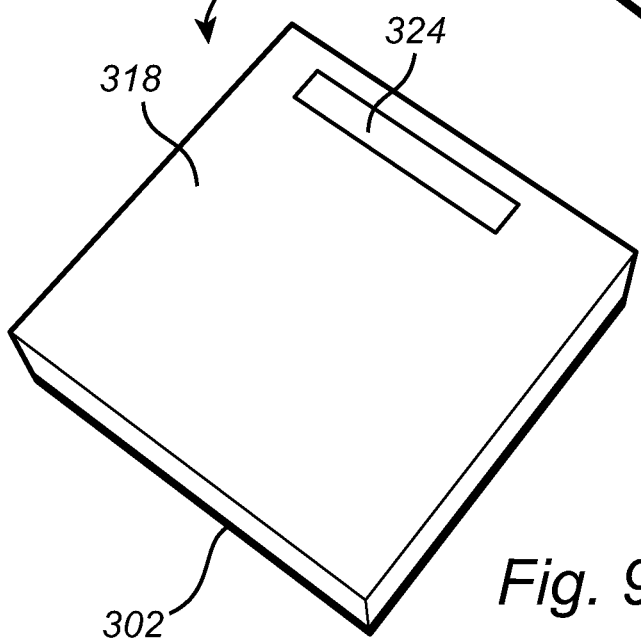

FIG. 9a-h illustrates a conceptual process flow for manufacturing the embodiment illustrated in FIG. 8. Starting from a substrate 312 such as a printed circuit board (PCB) having a plurality of electrical connection pads 306 thereon (FIG. 9a). A fingerprint sensor 308 is arranged on the substrate 302 (FIG. 9b). In a wire bonding step S903 (FIG. 9c), the fingerprint sensor 308 is electrically connected to at least one of the electrical connection pads 306. Additionally, and preferably in the same wire bonding step, a first bond wire loop 310 and a second bond wire loop 320 are formed in electrical and mechanical contact with a respective first 314 and second 315 connection pad. Subsequently, S905 a molding material 318 is applied (FIG. 9d) which covers the fingerprint sensor 308, the substrate 302, and at least part of the first bond wire loop 310 and the second bond wire loop 320. The thickness of the molding material is such that a upper portion 316 of the first bond wire loop 310 and a upper portion 317 of the second bond wire loop 320 are exposed at the surface of the molding material 318. Alternatively, the upper portions 316, 317 may be exposed after a step S907 of forming cavities or a cavity 322 (FIG. 9e) in the molding material in which the upper portions 316, 317 are exposed. A force sensing member 324 is deposited S909 (FIG. 9f) on the surface of the molding material 318 such that it makes electrical contact with the upper portions 316, 317 of the first bond wire loop 310 and the second bond wire loop 320.

Figure 10:
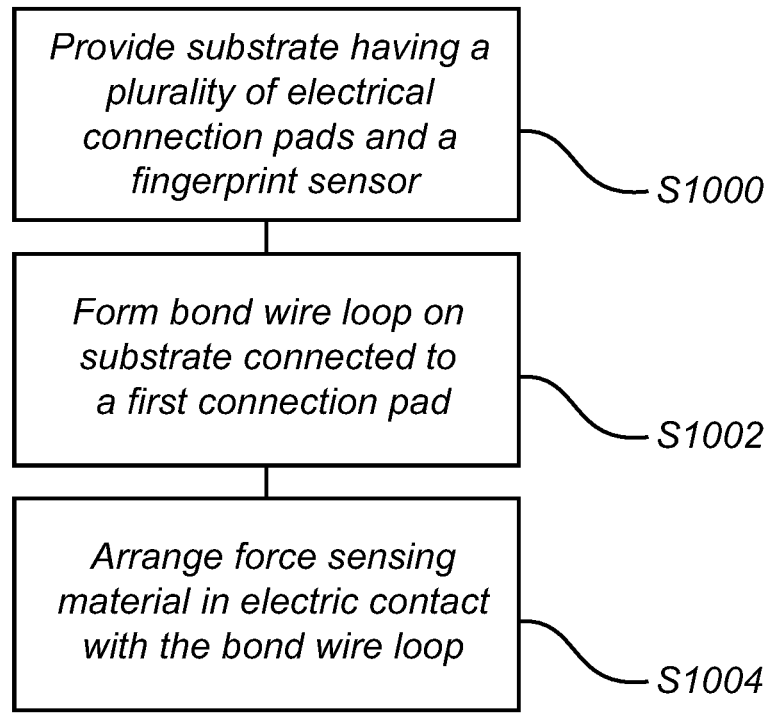
FIG. 10 is a flow-chart of method steps according to an embodiment of the invention.

FIG. 10 is a flow chart of method steps according to an embodiment of the invention for manufacturing a fingerprint sensor package comprising a fingerprint sensor on a provided S1000 substrate having a plurality of connection pads on the substrate, the fingerprint sensor being connected to at least one of the electrical connection pads. In a step S1002 a bond wire loop is formed from a bond wire. The bond wire loop is formed by two ends of the bond wire, wherein at least one of the ends is being mechanically and electrically attached to a first one of the electrical connection pads. A force sensing member is arranged S1004 in electrical contact with the first electrical connection pad via a upper portion of the bond wire loop and in electrical contact with a second one of the electrical connection pads different from the first electrical connection pad connected with the bond wire loop. The force sensing member may for example be deposited by a member deposition system or it may be arranged in place as part of a structure, e.g. a protective plate having the force sensing member deposited thereon. The force sensing member has at least one electrical property that is alterable in response to a deformation of the force sensing member, wherein the alternation of the electrical property is measureable across the electrical connection between the first electrical connection pad and the second electrical connection pad.

The fingerprint sensor may be connected to the at least one of the electrical connection pads with at least one bond wire. Preferably, step S702 comprises forming the bond wire loop and the bond wire connections for the fingerprint sensor in the same wire bonding step.

The fingerprint sensor package may advantageously be manufactured using CMOS technology, but other techniques and processes may also be feasible. For instance, an insulating substrate may be used and/or thin-film technology may be utilized for some or all process steps needed to manufacture the sensing arrangement.

Although the figures may show a sequence the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps. Additionally, even though the invention has been described with reference to specific exemplifying embodiments thereof, many different alterations, modifications and the like will become apparent for those skilled in the art.

In addition, variations to the disclosed embodiments can be understood and effected by the skilled addressee in practicing the claimed invention, from a study of the drawings, the disclosure, and the appended claims. Furthermore, in the claims, the word "comprising" does not exclude other elements or steps, and the indefinite article "a" or "an" does not exclude a plurality.

The invention claimed is:

1. A fingerprint sensor package comprising:
    a substrate having thereon a plurality of electrical connection pads;
    a fingerprint sensor arranged on the substrate and electrically connected to at least one of said electrical connection pads;
    a first bond wire loop and a second bond wire loop, each of the first and second bond wire loops being formed from a bond wire having two ends of which at least one end is mechanically and electrically attached to one of said electrical connection pads,
    a force sensing member in electrical contact with a first electrical connection pad via an upper portion of said first bond wire loop, and in electrical contact with a second one of said electrical connection pads different from the first electrical connection pad via an upper portion of said second bond wire loop,
    a molding material covering at least a top surface of the substrate, the fingerprint sensor, and a portion of the first and second bond wire loops, the molding material defining at least one cavity formed in a molding material surface having a depth such that the upper portion of the first and second bond wire loops is exposed in the at least one cavity, and a first metal contact arranged in the at least one cavity to provide an electrical connection from said bond wire loops to said force sensing member, said first metal contact being arranged in electrical and mechanical contact with said upper portion of said bond wire loops in the cavity, wherein an electrical property of the force sensing member is alterable in response to a deformation of the force sensing member, wherein a signal indicative of said alternation of said electrical property is measureable across the electrical connection between the first electrical connection pad and the second electrical connection pad.

2. The fingerprint sensor package according to claim 1, wherein said first metal contact is a bezel.

3. The fingerprint sensor package according to claim 1, wherein said force sensing member is arranged in said cavity.

4. The fingerprint sensor package according to claim 1, wherein said force sensing member comprises a quantum tunneling composite or a piezoelectric material, or a strain gauge configuration for measuring changes in electrical signal as a function of a force.

5. An electronic device comprising the fingerprint sensor package according to claim 1.

6. A method for manufacturing a fingerprint sensor package comprising a fingerprint sensor on a substrate having a plurality of connection pads on the substrate, said fingerprint sensor being connected to at least one of said electrical connection pads, the method comprising:

forming a first bond wire loop and a second bond wire loop from a bond wire, each of said first and second bond wire loops being formed by two ends of the bond wire, wherein at least one of the ends is being mechanically and electrically attached to a first one of said electrical connection pads, applying a molding material covering at least the top surface of the substrate, the fingerprint sensor, and a portion of each of the bond wire loops, opening at least one cavity in said molding material such as to access an upper portion of each of said bond wire loops, forming a first metal contact in the at least one cavity and arranged in electrical and mechanical contact with said upper portions of said bond wire loops, arranging a force sensing member in electrical contact with the first electrical connection pad via said upper portions of said bond wire loops and in electrical contact with a second one of said electrical connection pads different from the first electrical connection pad connected with the bond wire loop, wherein:

the first metal contact provides an electrical connection from one of said bond wire loops to said force sensing member, and an electrical property of the force sensing member is alterable in response to a deformation of the force sensing member, wherein said alternation of said electrical property is measureable across the electrical connection between the first electrical connection pad and the second electrical connection pad.

7. The method according to claim 6, wherein said fingerprint sensor is connected to said at least one of said electrical connection pads with at least one bond wire, wherein said bond wire loop and said bond wire connections for said fingerprint sensor are formed in the same wire bonding step.

8. The method according to claim 6, wherein said first metal contact is a bezel.

9. The method according to claim 6, comprising:

wherein said force sensing member is arranged in said at least one cavity in electrical contact with an accessed bond wire loop.

10. The method according to claim 9, comprising:

forming said first metal contact in said at least one cavity, arranging said force sensing member in said at least one cavity, and in contact with said first metal contact for connecting the force sensing member to the accessed bond wire loop in the at least one cavity.

11. The method according to claim 6, wherein said force sensing member is attached to a protective plate, wherein said method comprises:

arranging the protective plate on the molding material such that the force sensing member makes electrical contact with an accessed bond wire loop.

* * * * *